(12) United States Patent  
Rogren (10) Patent No.: US 8,525,305 B1  
(45) Date of Patent: Sep. 3, 2013

(54) LEAD CARRIER WITH PRINT-FORMED PACKAGE COMPONENTS

(75) Inventor: Philip E. Rogren, Half Moon Bay, CA (US)

(73) Assignee: EoPlex Limited, Hong Kong (CN)

( * ) Notice: Subject to any disclaimer, the term of this patent is extended or adjusted under 35 U.S.C. 154(b) by 0 days.

(21) Appl. No.: 13/135,210

(22) Filed: Jun. 28, 2011

Related U.S. Application Data

(60) Provisional application No. 61/359,784, filed on Jun. 29, 2010.

(51) Int. Cl.  
*H01L 23/495* (2006.01)

(52) U.S. Cl.  
USPC .... 257/666; 257/672; 257/676; 257/E23.031; 257/E23.034; 257/E23.052; 257/E23.055

(58) Field of Classification Search  
USPC ................. 257/666–677, E23.031–E23.059; 438/111, 112, 123, FOR. 366, FOR. 367, 438/FOR. 380, FOR. 377  
See application file for complete search history.

(56) References Cited

U.S. PATENT DOCUMENTS

| | | | | |
|---|---|---|---|---|
| 6,247,229 | B1 * | 6/2001 | Glenn | 29/841 |
| 6,429,508 | B1 * | 8/2002 | Gang | 257/678 |
| 7,939,933 | B2 * | 5/2011 | Itou et al. | 257/696 |
| 7,994,629 | B2 * | 8/2011 | Camacho | 257/690 |
| 8,049,311 | B2 * | 11/2011 | Lim et al. | 257/659 |

* cited by examiner

*Primary Examiner* — Jasmine Clark  
(74) *Attorney, Agent, or Firm* — Heisler & Associates (57) ABSTRACT

A lead carrier provides support for an integrated circuit chip and associated leads during manufacture as packages containing such chips. The lead carrier includes a temporary support member with multiple package sites. Each package site includes a die attach pad surrounded by a plurality of terminal pads. The pads are formed of a sintered electrically conductive material. A chip is mounted upon the die attach pad and wire bonds extend from the chip to the terminal pads. The pads, chip and wire bonds are all encapsulated within a mold compound. The temporary support member can be peeled away and then the individual package sites can be isolated from each other to provide completed packages including multiple surface mount joints for mounting within an electronics system board. Edges of the pads are contoured to cause the pads to engage with the mold compound to securely hold the pads within the package.

27 Claims, 5 Drawing Sheets

LEAD CARRIER WITH PRINT-FORMED PACKAGE COMPONENTS

CROSS-REFERENCE TO RELATED APPLICATIONS

This application claims benefit under Title 35, United States Code §119(e) of U.S. Provisional Application No. 61/359,784 filed on Jun. 29, 2010.

FIELD OF THE INVENTION

The following invention relates to lead carrier packages for use with an integrated circuit chip for effective interconnection of the integrated circuit chip in an electrical system. More particularly, this invention relates to lead frames and other lead carriers which are manufactured as an array of multiple package sites within a common assembly before and during combination with the integrated circuit, attachment of wire bonds and encapsulation within non-conductive material, before isolation into individual packages for use upon an electronics system board, such as a printed circuit board.

BACKGROUND OF THE INVENTION

The demand for smaller and more capable, portable electronic systems, combined with the increased level of integration in today's semiconductors, is driving a need for smaller semiconductor packages with greater numbers of input/output terminals. At the same time, there is relentless pressure to reduce the cost of all the components of consumer electronic systems. The quad flat no lead ("QFN") semiconductor package family is among the smallest and most cost effective of all semiconductor packaging types, but when fabricated with conventional techniques and materials, has significant limitations. For instance, with QFN technology the number of I/O terminals and the electrical performance that the technology can support is limited.

QFN packages P (FIGS. 5-7) are conventionally assembled on an area array lead frame 1 (FIGS. 1 and 2) etched from a copper sheet. A lead frame 1 can contain from tens to thousands of package sites, each comprised of a die attach pad 2 (FIGS. 1, 2 and 5-7) surrounded by one or more rows of wire bond pads 4 (FIGS. 2 and 5-7). All of these package P components are attached to a common frame 1 by pieces of copper to maintain the position of the package P components relative to the rest of the lead frame 1 and to provide an electrical connection to all of the components, to facilitate plating of the bonding and soldering surfaces.

These connected structures, commonly known as tie bars 3 (FIGS. 1, 2 and 5-7) short all of the components of the lead frame 1 together. Therefore, these tie bars 3 must be designed such that they can all be disconnected from the common shorting structure 6 (FIGS. 1 and 2) surrounding each package P site during singulation of the individual packages P from the lead frame 1, leaving each die attach pad 2 and wire bond pad 4 electrically isolated. Typically, the design to facilitate severing the electrical connection of the tie bars 3 to the lead frame) involves connecting the tie bars 3 to the copper shorting structure 6 (FIGS. 1 and 2) surrounding each package P site, just outside of the final package P footprint. This shorting structure 6 is sawn away (along line X of FIG. 2) during the singulation process, leaving the tie bars 3 exposed at the edge of the package P.

Figure 5:
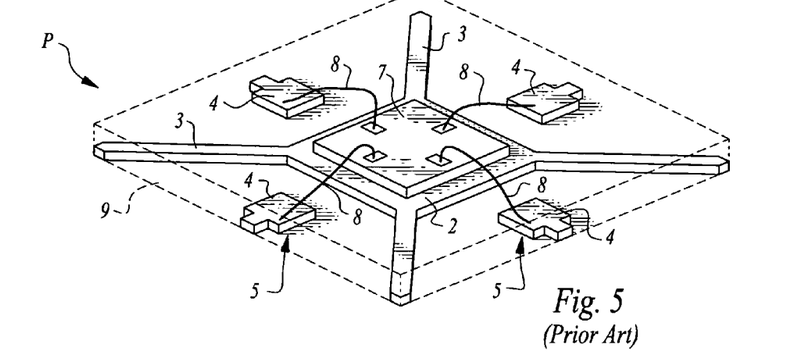
FIG. 5 is a perspective view of a prior art QFN package showing placement of an integrated circuit chip and wire bonds and illustrating in broken lines how encapsulation material is placed relative to other conductive structures within the package.
Figure 6:
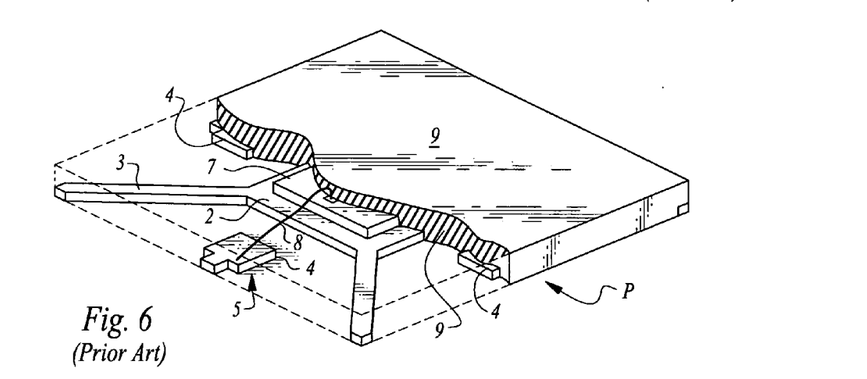
FIG. 6 is a perspective view similar to that which is shown in FIG. 5 but with the encapsulating mold compound in place, and with portions of the encapsulating mold compound cut away to reveal interior structures of the package.

The QFN lead frame 1 provides the parts of the package P that facilitate fixing the semiconductor die, such as an integrated circuit chip 7 (FIGS. 5-7) within the package P and the terminals that can be connected to the integrated circuit 7 through wire bonds 8 (FIGS. 5 and 6). The terminals, in the form of the wire bond pads 4, also provide a means of connecting to the electronic system board (such as a printed circuit board) through a solder joint 5 (FIGS. 5-7) on the surface opposite that of the wire bond 8 surface.

The requirement that all of the package P components be connected to the lead frame 1 by a metal structure, severely limits the number of leads that can be implemented in any given package P outline. For instance, wire bond pads 4 can be provided in multiple rows surrounding the die attach pads 2 with each row being a different distance away from the die attach pads 2. For any wire bond pads 4 inside the outermost row of wire bond pads 4, the tie bar 3 connecting structures must be routed between the pads 4 of the outer row, so that such tie bars 3 can extend to the common sorting structure 6 outboard of the package P isolation (along line X). The minimum scale of these tie bars 3 is such that only one can be routed between two adjacent pads 4. Thus, only two rows of pads 4 may be implemented in a standard QFN lead frame 1. Because of the current relationship between die size and lead count, standard QFN packages are limited to around one hundred terminals, with a majority of packages P having no more than about sixty terminals. This limitation rules out the use of QFN packaging by many types of dies that would otherwise benefit from the smaller size and lower cost of QFN technology.

While conventional QFN technology is very cost effective, there are still opportunities to further reduce the cost. After the integrated circuit chips 7 are attached and connected to the external lead wire bond pads 4 with wire bonds 8, the assembled lead frame 1 of multiple packages P is completely encapsulated with epoxy mold compound 9 (FIGS. 6 and 7), such as in a transfer molding process. Because the lead frame 1 is largely open front to back, a layer of high temperature tape T is applied to the back of the lead frame 1, prior to the assembly process, to define the back plane of each package P during molding. Because this tape T must withstand the high temperature bonding and the molding process, without adverse effect from the hot processes, the tape is relatively expensive. The process of applying the tape T, removing the tape T and removing adhesive residues, can add significant cost to processing each lead frame 1.

Figure 2:
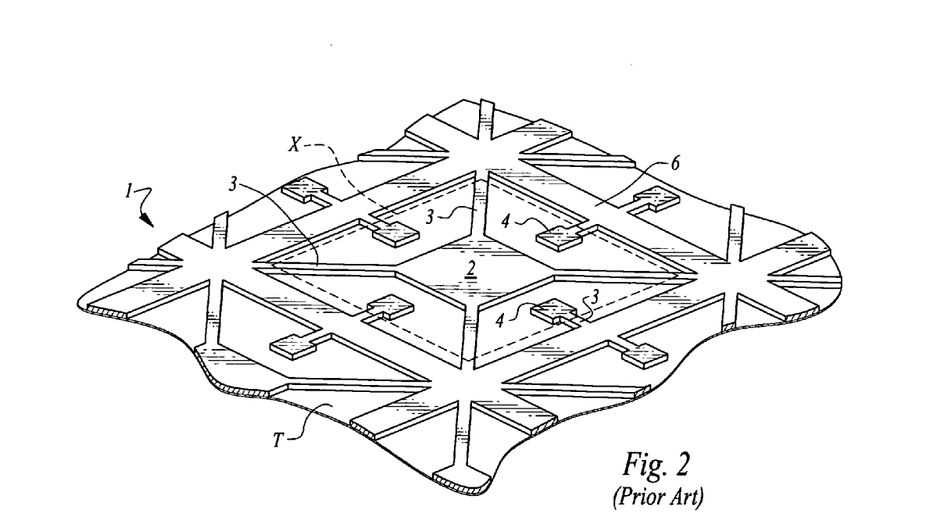
FIG. 2 is a perspective view of a detail of a portion of that which is shown in FIG. 1, along with dashed lines indicative of where cut lines are followed to separate individual package sites from the lead frame.

The most common method of singulation of the individual packages P from the lead frame 1 is by sawing (along line X of FIG. 2). Because the saw must remove all of the shorting structures 6 just outside the package P outline, in addition to cutting the epoxy mold compound 9, the process is substantially slower and blade life considerably shorter, as if only mold compound 9 is cut. Because the shorting structures 6 are not removed until the singulation process, this means that the dies cannot be tested until after singulation. Handling thousands of tiny packages P, and assuring each is presented to the tester in the correct orientation is much more expensive than being able to test the whole strip with each passage P in a known location.

A lead frame 1 based process, known as punch singulation, to some extent addresses the problem associated with saw singulation and allows testing in the lead frame 1 strip, but substantially increases cost by cutting utilization of the lead frame 1 to less than fifty percent of that of a saw singulated lead frame 1. Punch singulation also imposes a requirement for dedicated mold tooling for every basic lead frame design. Standard lead frames 1 designed for saw singulation use a single mold cap for all lead frames 1 of the same dimensions.

In both saw singulated and punch singulated packages P, the tie bars 3 are left in the completed packages P and represent both capacitive and inductive parasitic elements that cannot be removed. These now superfluous pieces of metal significantly impact the performance of the completed package P, precluding the use of QFN packages P for many high performance integrated circuit chips 7 and applications. Furthermore, the cost of this potentially rather valuable superfluous metal can be substantial and is wasted by the QFN process.

Several concepts have been advanced for QFN type substrates that eliminate the limitations of etched lead frames. Among those is a process that deposits the array of package components on a sacrificial carrier by electroplating. The carrier is first patterned with plating resist and the carrier, usually stainless steel, is slightly etched to enhance adhesion. The strip is then plated with gold and palladium to create an adhesion/barrier layer, then plated with Ni to around sixty microns thick. The top of the Ni bump is finished with a layer of electroplated Ag to facilitate wire bonding. After the strip is assembled and molded, the carrier strip is peeled away to leave a sheet of packaged dies that can be tested in the sheet and singulated at higher rates and yields than with conventional lead frames. This electroplated approach eliminates all of the issues associated with connective metal structures within the package and allows for very fine features. The plating process, however, results in strips that are very expensive compared to standard etched lead frames. This approach is described in U.S. Pat. No. 7,187,072 by Fukutomi, et al.

Another approach is a modification of the etched lead frame process wherein the front side pattern is etched to about half the thickness of the lead frame, and the backside of the lead frame strip is left intact, until after the molding process is complete. Once molding is complete, the backside pattern is printed and the lead frame etched to remove all of the metal except for the backside portion of the wire bond pads and die paddle. This double etch process eliminates all of the issues associated with connective metal structures within the package. The cost of the double etched lead frame is less than the electroplated version, but still more expensive than standard etched lead frames, and the etching and plating processes are environmentally undesirable.

One failure mode for a lead frame packaged integrated circuit is for the wire bond pads 4 to become disconnected from wire bonds 8 coupled thereto, especially when a shock load is experienced by the package (such as when an electronic device incorporating the package therein is dropped and hits a hard surface). The wire bond pad 4 can remain mounted to a printed circuit board or other electronic system board while separating slightly from surrounding epoxy mold compound, allowing the wire bond 8 to be severed from the wire bond pad 4. Accordingly, a further need exists for a lead carrier package which better holds the wire bond pads 4 within the entire package, especially when shock loads are experienced.

SUMMARY OF THE INVENTION

With this invention a lead carrier is provided with an array of separate package sites in the form of a multi-package lead carrier. A sintered material, typically beginning as silver powder, is placed upon a temporary layer formed of high temperature resistant material, such as stainless steel. The stainless steel or other material forming the temporary layer supports the sintered material while it is heated to a sintering temperature.

The sintered material is located upon the temporary layer in separate structures preferably electrically isolated from each other (other than through the temporary layer) in the form of die attach pads and terminal pads. One or more terminal pads surround each die attach pad. Each die attach pad is configured to have an integrated circuit or other semiconductor device supported thereon. Wire bonds can be routed from the integrated circuit upon the die attach pad to the separate terminal pads surrounding each die attach pad. Mold compound can then be applied which encapsulates the die attach pads, integrated circuits, terminal pads and wire bonds. Only surface mount joints defining under portions of the die attach pad and terminal pads remain unencapsulated because they are adjacent the temporary layer.

Once the mold compound has hardened, the temporary layer can be peeled away from the remaining portions of the lead carrier, leaving a plurality of package sites with individual die attach pads and associated integrated circuits, terminal pads and wire bonds all embedded within a common mold compound. The individual package sites can then be cut from each other by cutting along boundaries between the package sites and surface mounted through the surface mount joints to an electronics system board or other support.

Because the package sites and individual pads within the package sites are each electrically isolated from each other, other than through the temporary layer, these individual pads can be tested for electrical continuity and other electrical performance characteristics at a variety of different times, such as before mounting of the integrated circuit or after encapsulation within the mold compound and removal of the temporary layer, but before singulation into separate packages. Such testing can occur while the array of pads is supported upon the temporary layer or after removal from the temporary layer. Furthermore, such packages could be tested after isolation from adjacent packages on the lead carrier utilizing known testing equipment utilized with QFN packages or other testing equipment.

Additionally, each pad including the die attach pads and the terminal pads preferably has edges around peripheries thereof which are configured to mechanically engage with the mold compound somewhat. In particular, these edges can taper in an overhanging fashion, or be stepped in an overhanging fashion, or otherwise be configured so that at least a portion of each edge spaced from a bottom thereof extends further laterally than portions of each edge closer to a bottom portion of each edge. Thus, the mold compound, once hardened, locks the pads securely into the mold compound. In this way, the pads resist detachment from the wire bonds or otherwise becoming detached from the mold compound, and keep the entire package as a single unitary package.

OBJECTS OF THE INVENTION

Accordingly, a primary object of the present invention is to provide a system for proving the electrical interconnect components of a semi-conductor package that allows for the implementation of a simplified QFN process to more easily produce QFN packaged semiconductor dies.

Another object of the present invention is to provide a system and method for providing the electrical interconnect components of a semiconductor package arrayed on a sacrificial carrier that can be peeled away after molding, to yield a continuous strip of multiple semiconductor packages with pads with no electrical connection between any two pads, to facilitate testing at various different stages of manufacture and avoidance of material waste.

Another object of the present invention is to provide the electrical interconnect components of a semiconductor package in a manner that enables higher electrical performance while utilizing a minimum amount of metal therein to facilitate electrical connection of a semiconductor die to the system board of an electronic system.

Another object of the present invention is to provide the electrical interconnect components of a semiconductor package that lowers the assembly cost of the package by simplifying and eliminating steps from a standard QFN assembly process.

Another object of the present invention is to provide the electrical interconnect components of a semiconductor package that allow for the inclusion of more than two rows of input/output terminals and many times the number of input/output terminals than are practical with lead frame based QFN packages.

Another object of the present invention is to provide electrical interconnect components of a semiconductor package that allows greater design flexibility to incorporate features, such as multiple power and ground structures and multiple die attach pads, when compared to lead frame based QFN packages.

Another object of the present invention is to provide a lead carrier with multiple integrated circuit mounting package sites thereon which can be manufactured in a low cost high quality manner.

Another object of the present invention is to provide a semiconductor package for electrical interconnection to adjacent components which is highly resistant to damage associated with shock loads thereto.

Another object of the present invention is to provide a lead carrier with multiple integrated circuit mounting package sites which exhibits high performance electrically by minimizing excess conducting portions therein.

Another object of the present invention is to provide a lead carrier which has package sites thereon which can be tested at multiple stages in the manufacturing process in a simple and automated fashion.

Other further objects of the present invention will become apparent from a careful reading of the included drawing figures, the claims and detailed description of the invention.

DESCRIPTION OF THE PREFERRED EMBODIMENT

Referring to the drawings, wherein like reference numerals represent like parts throughout the various drawing figures, reference numeral 10 is directed to a lead carrier (FIGS. 3 and 4) which can support a plurality of package sites 12 thereon upon a temporary support member 20 for manufacture of a plurality of packages 100 (FIGS. 9 and 10) including an integrated circuit chip 60 and to provide for a large number of inputs and outputs into the integrated circuit chip 60. The invention is also directed to the plurality of resulting packages 100 isolated from the plurality of package sites 12 and a lead carrier 10' (FIG. 17) after manufacture of the individual packages 100 and removal of the packages 100 from the common temporary support member 20 of the lead carrier 10.

In essence, and with particular reference to FIGS. 3, 4, 8 and 9, basic details of the lead carrier 10 and package 100 are described, according to a preferred embodiment of this invention. The lead carrier 10 includes a temporary support member 20 of thin planar high temperature resistant material, such as stainless steel. A plurality of die attach pads 30 and terminal pads 40 are arrayed on the temporary support member 20 at package sites 12, with multiple terminal pads 40 surrounding each die attach pad 30.

Figure 8:
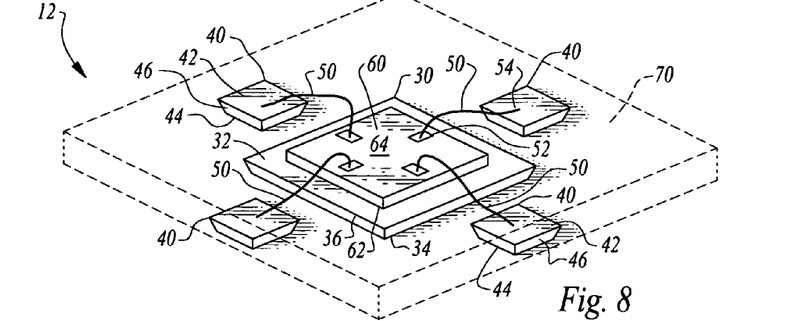
FIG. 8 is a perspective view of an individual package site on the lead carrier of this invention after placement of an integrated circuit chip and wire bonds, and illustrating in broken lines the position of mold compound.
Figure 9:
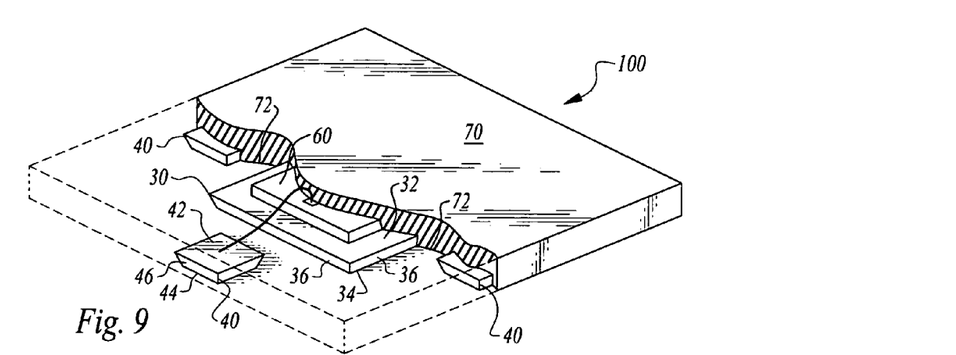
FIG. 9 is a perspective view similar to FIG. 8 but with the mold compound shown in place encapsulating conductive structures within the package, and with portions of the mold compound cut away to reveal interior details of the package.

An integrated circuit chip 60 is mounted upon the die attach pad 30 (FIGS. 8 and 9). Wire bonds 50 are joined between input output terminals on the chip 60 and the terminal pads 40. The entire package 100 including the die attach pad 30, terminal pad 40, wire bonds 50 and chip 60 are encapsulated within a mold compound 70 other than surface mount joint 90 portions (FIG. 10) defining an underside of the package 100. The mold compound 70 is typically applied to the lead carrier 10 to surround each of the package sites 12. Later isolation of each package 100 occurs by cutting of the mold compound 70 to provide multiple packages 100 from the original lead carrier 10.

Figure 1:
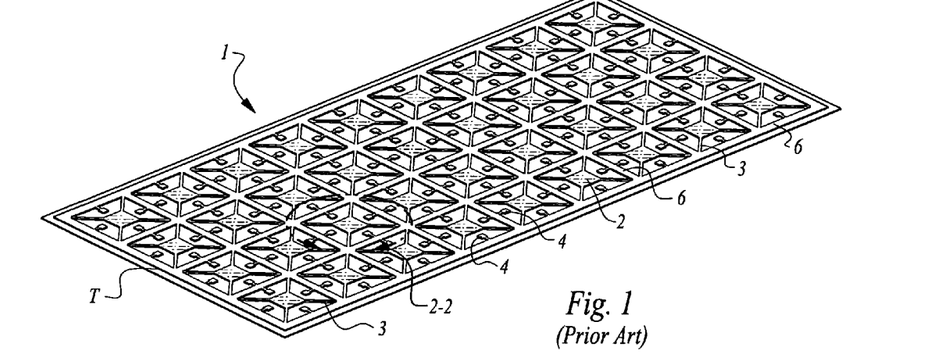
FIG. 1 is a perspective view of a QFN lead frame of a simplified variety and illustrating prior art lead frame technology.
Figure 7:
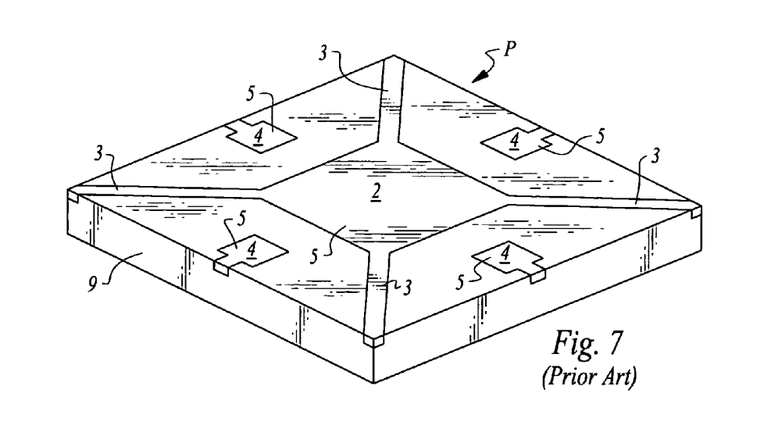
FIG. 7 is a perspective view similar to that which is shown in FIG. 6 but from below to illustrate solder joints available for surface mounting of the package upon an electronic system board or other interface within an electrical system.

With particular reference to FIGS. 1 and 2, details of a prior art lead frame 1 of a "quad flat no lead" (QFN) variety are described for comparison and contrast to the details of the lead carrier 10 of this invention. In the embodiment shown, the QFN lead frame 1 is a planar structure of etched conductive material. This etched conductive material is etched into distinct die attach pads 2 and wire bond pads 4, each joined to a common shorting structure 6 through tie bars 3. This entire etched QFN lead frame 1 is mounted upon molding tape T so that epoxy mold compound 9 can be applied to the lead frame 1 and encapsulate the pads 2, 4 (FIGS. 5-7).

Before such encapsulation, an integration of the chip 7 is mounted upon the die attach pad 2. Wire bonds 8 are placed between the wire bond pads 4 and input/output terminals on the chip 7. The mold compound 9 can then entirely encapsulate the pads 2, 4 as well as the chip 7 and wire bonds 8. The mold compound is prevented from encapsulating an underside of the pads 2, 4 by the tape T. After the mold compound 9 has hardened, the tape T can be peeled away so that solder joints 5 (FIG. 7) are presented on an underside of the lead frame 1. Finally, the separate QFN packages P are isolated by cutting (along cut lines X of FIG. 2) to isolate each package P from the overall lead frame 1.

Importantly, it should be noted that portions of the tie bars 3 extending from the die attach pads 2 and the wire bond pads 4 remain within the package P. Some portions of these tie bars 3 actually extend out of an edge of the package P (FIGS. 6 and 7). Furthermore, the common shorting structure 6 (FIGS. 1 and 2) is not part of any package P. Thus, the common shorting structure 6 is typically wasted. Furthermore, remaining portions of the tie bars 3 within each package P do not provide any beneficial purpose and hence are also wasted within the package P. Such tie bar 3 remnants can also have a negative impact on the performance of the package P and the chip 7 within the package P. For instance, a portion of the tie bars 3 extending out of edges of the mold compound 9 of the package P presents an opportunity for undesirable shorting or for electromagnetic interference and "noise," such that certain electronics applications are not well served by prior art QFN packages P. Even when such prior art QFN packages P are suitable, waste associated with the common shorting structure 6 and tie bars 3 embedded within the package P is undesirable. Furthermore, the tape T is not reusable and is another wasted expense utilizing known prior art QFN lead frame 1 and package P techniques.

Figure 3:
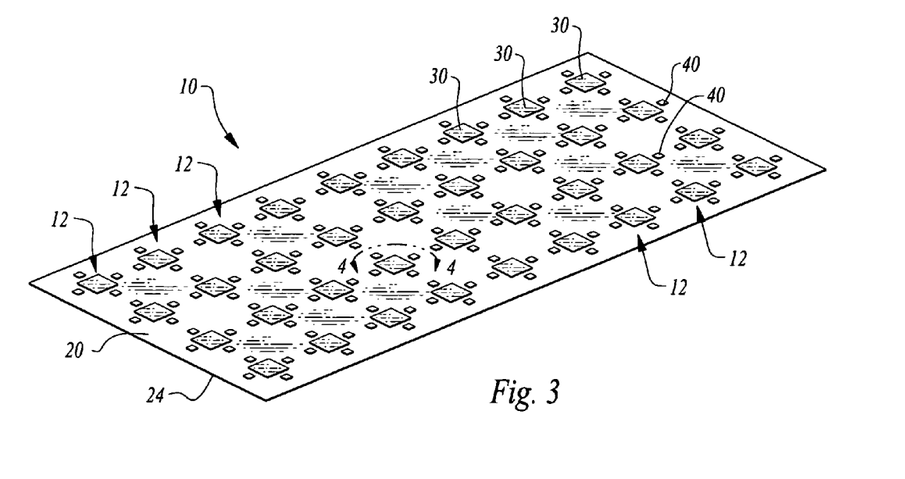
FIG. 3 is a perspective view of a lead carrier according to this invention with multiple separate package sites thereon and mounted upon a temporary support member.
Figure 4:
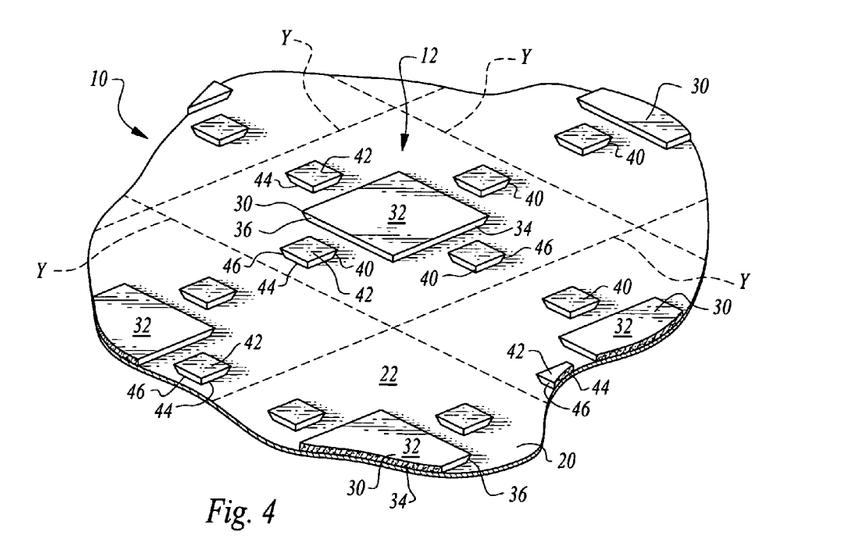
FIG. 4 is a perspective view of a detail of a portion of that which is shown in FIG. 3 and further illustrating details of each package site before mounting of an integrated circuit chip, attachment of wire bonds and encapsulation within mold compound.

Referring to FIGS. 3 and 4, specific details of the lead carrier 10 of this invention as well as the temporary support member 20 and pads 30, 40 are described, according to an exemplary embodiment. This exemplary embodiment is significantly simplified over a typical preferred embodiment in that each package site 12 only shows four terminal pads 40 surrounding each die attach pad 30. Typically, such terminal pads 40 would be presented in numbers of dozens or potentially even hundreds surrounding each die attach pad 30. It is also conceivable that as few as one terminal pad 40 would be provided adjacent each die attach pad 30. Such terminal pads 40 would typically be presented in multiple rows including an innermost row closest to the die attach pad 30, an outermost row of terminal pads 40 most distant from the die attach pad 30 and potentially multiple intermediate rows between an innermost row and an outermost row of terminal pads 40.

Figure 10:
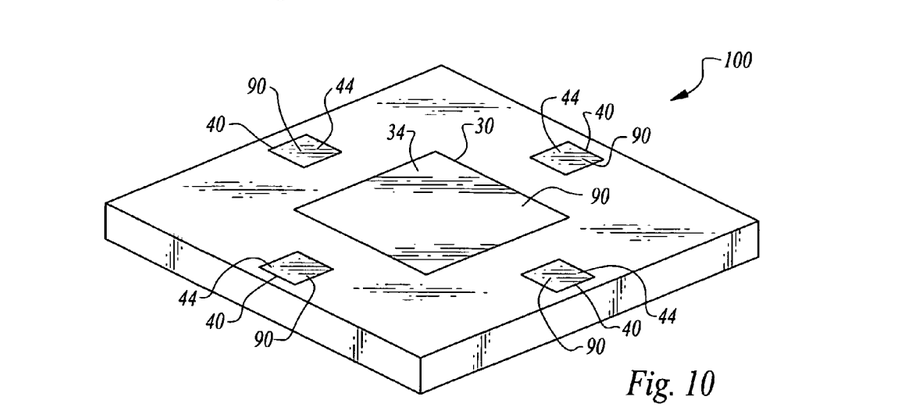
FIG. 10 is a perspective view from below of the package and illustrating surface mount joints of the package according to this invention.
Figure 11:
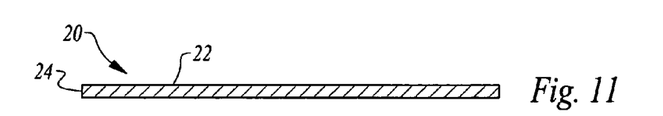
FIGS. 11-17 are full sectional views of a temporary support member and lead carrier during the process of manufacturing the semiconductor supporting package according to this invention.

The lead carrier 10 is a planar structure that is manufactured to include multiple package sites 12 and to support these package sites 12 during their manufacture and through testing and integration with integrated circuit chips 60 (or other semiconductor devices, such as diodes or transistors) and wire bonds 50 (FIGS. 8 and 9) to facilitate the ultimate production of multiple packages 100 (FIGS. 9 and 10). The lead carrier 10 includes a temporary support member 20. This temporary support 20 is a thin planar sheet of high temperature resistant material, most preferably stainless steel. This member 20 includes a top surface 22 upon which other portions of the lead carrier 10 are manufactured. An edge 24 of the temporary support member 20 defines a perimeter of the temporary support member 20. In this exemplary embodiment, this edge 24 is generally rectangular.

The temporary support member 20 is preferably sufficiently thin that it can flex somewhat and facilitate peeling removal of the temporary support member 20 from the lead carrier 10 (or vice versa) after full manufacture of packages 100 at the package sites 12 and lead carrier 10 (FIGS. 8-10 and 17). The lead carrier 10' (FIG. 17) refers to the lead carrier after it has had the temporary support member 20 removed therefrom.

The top surface 22 of the temporary support member 20 supports a plurality of package sites 12 thereon with each package site 12 including one die attach pad 30 and a plurality of terminal pads 40 surrounding each die attach pad 30. Cut lines Y generally define boundaries of each package site 12 (FIG. 4).

The die attach pads 30 and terminal pads 40 exhibit a different geometry and location, but are preferably formed of similar material. In particular, these pads 30, 40 are preferably formed of a sintered material. According to a preferred embodiment, these pads 30, 40 begin as a powder of electrically conductive material, preferably silver, mixed with a suspension component. This suspension component generally acts to give the silver powder a consistency of paste or other flowable characteristics so that the silver powder can best be handled and maneuvered to exhibit the desired geometry for the pads 30, 40.

A mixture of this suspension component and the silver powder or other electrically conductive metal powder is heated to a sintering temperature for the metal powder. The suspension component boils into a gas and is evacuated from the lead frame 10. The metal powder is sintered into a unitary mass having the shape desired for the die attach pads 30 and terminal pads 40.

The temporary support member 20 is configured to have thermal characteristics such that it maintains its flexibility and desired degree of strength and other properties up to this sintering temperature for the electrically conductive material forming the pads 30, 40. Typically this sintering temperature is approaching the melting point for the metal powder that is sintered into the pads 30, 40.

Figure 12:
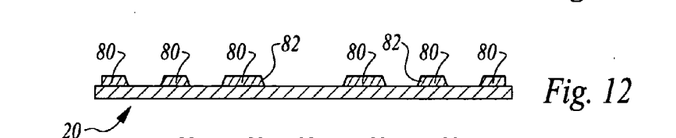
Figure 13:
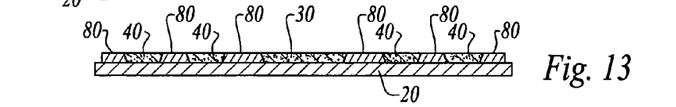
Figures 14, 15:
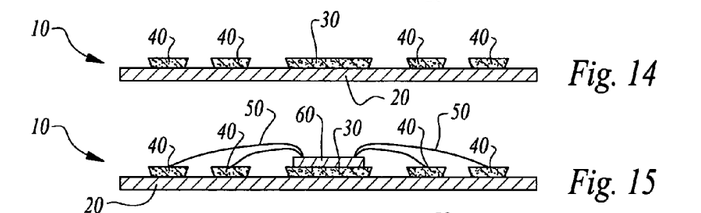

With reference to FIGS. 11-14, a depiction of the lead carrier 10 is presented in sequential steps for forming of the pads 30, 40. Note from FIG. 12 that a temporary form material 80 is first placed upon the temporary support member 20. This form material 80 can be printed onto the lead carrier 10 or could be etched into a continuous material pre-placed upon the temporary support member 20, or otherwise formed. Lateral surfaces 82 of the temporary form material 80 define edges of voids between the temporary form material 80. These voids are then filled with the mixture of metal powder and the suspension component by flowing this mixture into these voids. When the sintering process occurs and the temporary support member 20 as well as the temporary form material 80 and metal powder and suspension mixture are heated, not only is the metal powder sintered and the suspension component volatilized and removed, but also the temporary form material 80 is volatilized and removed from the package sites 12 on the lead carrier 10. Thus, after sintering only the pads 30, 40 of sintered material remain upon the temporary support member 20 (FIG. 14).

The die attach pad 30 can have a variety of different sizes and geometries. Most preferably, the die attach pad 30 will include a substantially planar top side 32 opposite a substantially bottom side 34 which rests upon the top surface 22 of the temporary support member 20. An edge 36 of the die attach pad 30 defines a perimeter shape of the die attach pad 30. This edge 36 preferably is not oriented within a plane perpendicular to the temporary support member 20, but has a taper or otherwise is configured to be contoured so that an at least partial overhang exists with an upper extent of each edge 36 overhanging a lower extent of each edge 36.

Figure 16:
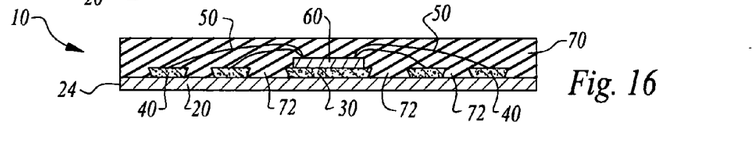
Figure 17:
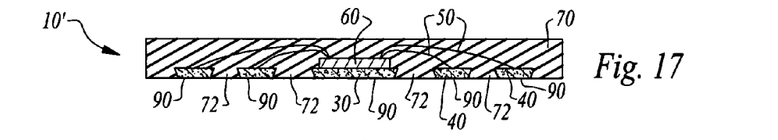

This overhang relationship can be continuous, such as by tapering the edge 36 as shown. In alternative forms (FIG. 18) the edge 36 can have other contours such as a stepped contour and still provide some form of overhang. In other forms, so long as at least some portion of the edge 36 overhangs a portion of the edge 36 closer to a lower extent of the edge 36, a form of overhang is provided. As can be seen in FIGS. 16 and 17, after the mold compound 70 has encapsulated the pads 30, 40 this overhang in the edges 36 of the die attach pads 30 cause the die attach pads 30 to be held within the mold compound 70, especially during removal of the temporary support member 20.

The terminal pads 40 preferably are similar in form to the die attach pads 30 except that they are smaller and are provided in large numbers surrounding each die attach pad 30 within each package site 12. Thus, each terminal pad 40 includes an upper side 42 opposite a lower side 44 with the lower side 44 abutting the temporary support member 20. An edge 46 defines a perimeter of each terminal pad 40. The edge 46 of each terminal pad 40 preferably is contoured similar to the edge 36 of the die attach pad 30 so that the terminal pads 40 are similarly held securely within each package 100 as are the die attach pads 30 as described in detail above.

While only four terminal pads 40 are shown around each die attach pad 30 in the exemplary embodiment depicted in FIGS. 3 and 4, preferably the number of terminal pads 40 surrounding each die attach pad 30 would be on the order of dozens or hundreds of terminal pads 40 surrounding each die attach pad 30. Also, typically the terminal pads 40 would be arrayed in rows surrounding each die attach pad 30. The terminal pads 40 could be smaller or larger relative to the die attach pad 30 as depicted in this exemplary embodiment. While the edges 36, 46 of the pads 30, 40 are each shown having an overhanging contour, it is conceivable that only some of the edges 36, 46 of each pad 30, 40 would have such an overhanging contour and still provide some benefits according to this aspect of this invention.

Preferably, the top side 32 of each die attach pad 30 and the upper side 42 of each terminal pad 40 are in a common plane. However, it is conceivable that these top sides 32 and upper sides 42 could have differing heights, and that these sides 32, 42 could be in a form other than completely planar and still provide some of the benefits according to this invention. The bottom sides 34, 44 define surface mount joints 90 within each package 100 after completion of the manufacturing process (FIG. 10).

With particular reference to FIGS. 8-10, details of each package 100 after further manufacture upon the lead carrier 10 at the various package sites 12 are described, according to this exemplary embodiment. An integrated circuit chip 60 is mounted upon the die attach pad 30 typically with a lower side of the integrated circuit chip 60 electrically coupled to the die attach pad 30. Such electric coupling can be common to "ground" for the chip 60 or common to some other reference for the chip 60, or can have some other electrical state within an overall electrical system in which the package 100 is utilized. The chip 60 includes a base 62 defining a lower portion thereof in contact with the top side 32 of the die attach pad 30. An upper surface 64 of the chip 60 is provided opposite the base 62. This upper surface 64 has a plurality of input output junctions which can be terminated to one end of a wire bond 50 (FIGS. 8 and 9).

One wire bond 50 is preferably terminated between each input output junction on the chip 60 and a surrounding terminal pad 40. Thus, each wire bond 50 has a chip end opposite a terminal end. Using known wire bond 50 terminating techniques, such as those used with QFN lead frames, these wire bonds 50 are coupled between the chip 60 and the terminal pads 40.

To complete the package 100 forming process, mold compound 70 is flowed over the lead carrier 10 and allowed to harden in a manner completely encapsulating each of the die attach pads 30, terminal pads 40, wire bonds 50 and integrated circuit chips 60. This mold compound 70 can mold against the top surface 22 of the temporary support member 20. Thus, the surface mount joints 90 of each pad 30, 40 remain exposed after removal of the temporary support member 20 (FIG. 10). The mold compound 70 is typically of a variety which is a fluid form at a first temperature but which can harden when adjusted to a second temperature.

The mold compound 70 is formed of a substantially non-conductive material such that the pads 30, 40 are electrically isolated from each other. The mold compound 70 flows between the pads 30, 40 to provide interlocks 72 (FIGS. 16 and 17) which tend to hold the pads 30, 40 within the overall package 100 and together with the mold compound 70. Such interlocks 72 keep the terminal pads 40 from becoming detached from the wire bonds 50. Such detachment propensity is first resisted when the temporary support member 20 is removed from the lead carrier 10, and again beneficially is resisted when the package 100 is in use and might experience shock loads that might otherwise detach the terminal pads 40 from the package 100. These interlocks 72 can have a variety of different shapes as defined above associated with the edges 36, 46 of the pads 30, 40, and originally based on the contour of the lateral surfaces 82 of the temporary form material 80 (FIGS. 12 and 13).

After hardening of the mold compound 70, the package 100 is provided in an array on the lead carrier 10 with each package 100 including a top 102 opposite a bottom 104 and with perimeter sides 106. Beneficially, the perimeter sides 106 are not required to have any electrically conductive material extending therefrom, in contrast to prior art QFN packages P (FIGS. 6 and 7), which must.

Figure 18:
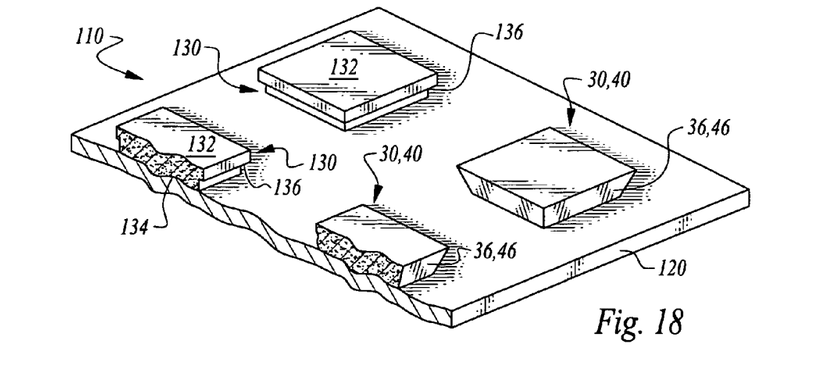
FIG. 18 is a perspective view of an alternative lead carrier with alternative pads illustrated having different edge contours to exhibit different engagement properties with surrounding encapsulating mold compound.

With reference to FIG. 18, details of an alternative lead carrier 110 are described. In this alternative lead carrier 110 a temporary support member 120 has alternative pads 130 resting thereon. These alternative pads 130 include a top side 132 opposite a bottom side 134 and with a stepped edge 136 thereon. This stepped edge 136 is an alternative edge to the edges provides on the terminal pads 30, 40 described above. Such a stepped edge 136 still provides a form of interlocking with the mold compound 70 to beneficially hold the pads 30, 40 within the entire package 100.

This disclosure is provided to reveal a preferred embodiment of the invention and a best mode for practicing the invention. Having thus described the invention in this way, it should be apparent that various different modifications can be made to the preferred embodiment without departing from the scope and spirit of this invention disclosure. When structures are identified as a means to perform a function, the identification is intended to include all structures which can perform the function specified. When structures of this invention are identified as being coupled together, such language should be interpreted broadly to include the structures being coupled directly together or coupled together through intervening structures. Such coupling could be permanent or temporary and either in a rigid fashion or in a fashion which allows pivoting, sliding or other relative motion while still providing some form of attachment, unless specifically restricted.

What is claimed is:

1. A lead carrier for providing electrical interconnection of an integrated circuit chip within an electrical system, comprising in combination:
a temporary layer formed of high temperature resistant material;
said temporary layer having a top surface;
at least two sintered structures upon said top surface of said temporary layer;
said sintered structures formed of electrically conductive material;
a semiconductor device upon one of said at least two sintered structures;
a wire bond between said semiconductor device and one of said at least two sintered structures spaced from said semiconductor device;
said sintered structures, said semiconductor device and said wire bond at least partially encapsulated within a substantially electrically non-conductive material; and
said temporary layer sufficiently flexible to allow peeling removal from said sintered structures and said encapsulating substantially electrically non-conductive material.

2. The lead carrier of claim 1 wherein said temporary layer is formed of stainless steel, said temporary layer thin enough to flex for peeling removal from said sintered structures and said encapsulating substantially electrically non-conductive material.

3. The lead carrier of claim 2 wherein said temporary layer has a melting point higher than a sintering temperature of said sintered structures.

4. The lead carrier of claim 3 wherein said sintered structures are formed of a material including silver and said temporary layer is formed of stainless steel.

5. The lead carrier of claim 4 wherein said sintered structures have a form resulting from a mixture of a suspension component and a silver powder that are sintered to remove said suspension component and sinter said silver powder into a unitary solid.

6. The lead carrier of claim 1 wherein said at least two sintered structures include at least one die attach pad adapted to support an integrated circuit thereon, and a plurality of input/output terminal pads, said die attach pad spaced from said terminal pads, said die attach pad larger than said terminal pads.

7. The lead carrier of claim 6 wherein said die attach pad is electrically isolated from said terminal pads, other than through said temporary layer.

8. The lead carrier of claim 7 wherein a plurality of terminal pads surround each die attach pad, and wherein wire bonds join each terminal pad to an integrated circuit upon said die attach pad surrounded by said terminal pads.

9. The lead carrier of claim 1 wherein at least one of said at least two sintered structures has a portion thereof above a bottom side that is larger than a portion thereof closer to said bottom side, such that said encapsulating substantially electrically non-conductive material tends to hold said at least one sintered structure within said encapsulating substantially electrically non-conductive material.

10. The lead carrier of claim 9 wherein said at least one sintered structure exhibits a tapering edge tapering between a top side and a bottom side, with said edge adjacent said top side overhanging said edge adjacent said bottom side.

11. The lead carrier of claim 9 wherein said at least one sintered structure includes an at least partially stepped edge between a top side and a bottom side, with said stepped edge at said top side overhanging said stepped edge at said bottom side.

12. A lead carrier and semiconductor, comprising in combination:
at least one die attach pad formed of electrically conductive material;
said die attach pad having a top side opposite a bottom side with edges between said top side and said bottom side;
at least one terminal pad formed of electrically conductive material and spaced from said die attach pad;
said terminal pad having an upper side opposite a lower side, with edges between said upper side and said lower side;
said die attach pad and said terminal pad each being a sintered structure of electrically conductive material;
a semiconductor upon said top side of said die attach pad;
at least one wire bond between said terminal pad and said semiconductor;
said die attach pad, said terminal pad, said semiconductor and said wire bond at least partially encapsulated within a substantially electrically non-conductive material; and
at least one of said die attach pad and said plurality of terminal pads having a contoured edge which is at least partially contoured to hold said pad to said substantially electrically non-conductive material.

13. The package of claim 12 wherein said contoured edge has an upper extent opposite a lower extent, at least a first portion of said edge spaced from said lower extent defining a lateral pad width greater than a second portion of said edge closer to said lower extent than said first portion, such that said first portion overhangs said second portion.

14. The package of claim 13 wherein said edge has a stepped contour with portions above said step and closer to said upper extent of said edge defining an overhang relative to portions of said edge below said step and closer to said lower extent of said edge.

15. The package of claim 13 wherein said edge exhibits a taper with portions of said edge most distant from said lower extent overhanging portions of said edge closer to said lower extent.

16. The package of claim 12 wherein said die attach pads and said terminal pads are each fully encapsulated within said substantially electrically non-conductive material except on said bottom side of said die attach pad and said lower sides of said terminal pads.

17. The package of claim 16 wherein said bottom side of said die attach pad and said lower side of said terminal pads are located within a common plane.

18. The package of claim 12 wherein said pads are formed of a sintered electrically conductive material.

19. The package of claim 12 wherein said pads are electrically isolated from each other other than through said wire bonds and said integrated circuit.

20. The package of claim 12 wherein the package is one of a plurality of packages encapsulated within a common said substantially electrically non-conductive material.

21. The package of claim 20 wherein said plurality of packages are each located upon a common flexible stainless steel support layer having a melting point higher than a sintering temperature of said electrically conductive material forming said die attach pad and said terminal pads.

22. A lead carrier for supporting an electronic device having a plurality of inputs and/or outputs, the lead carrier comprising in combination:

a plurality of electrically conductive pads spaced from each other;

said pads formed of a sintered electrically conductive material; and said pads located upon a temporary layer with a melting point greater than a sintering temperature of said material forming said pads.

23. The lead carrier of claim 22 wherein a layer of substantially electrically non-conductive material is positioned encapsulating said plurality of electrically conductive pads on all sides thereof other than portions of said pads abutting said temporary layer.

24. The lead carrier of claim 23 wherein said temporary layer is sufficiently flexible to allow peeling removal from said pads and said encapsulating substantially electrically non-conductive material layer.

25. The lead carrier of claim 24 wherein at least one of said plurality of electrically conductive pads has an edge with an upper extent opposite a lower extent, said lower extent adjacent said temporary layer, at least a first portion of said edge spaced from said lower extent defining a lateral pad width greater than a second portion of said edge closer to said lower extent of said edge than said first portion, such that said first portion overhangs said second portion.

26. The lead carrier of claim 25 wherein said plurality of electrically conductive pads includes a plurality of die attach pads and a plurality of terminal pads, with at least one of said terminal pads associated with each said die attach pad, each of said plurality of die attach pads and said plurality of terminal pads located upon a single common temporary layer and encapsulated within a common substantially electrically non-conductive material layer.

27. The lead carrier of claim 22 wherein a semiconductor is located upon a top side of at least one of said plurality of electrically conductive pads, with a wire bond extending from said semiconductor to an electrically conductive pad spaced from said semiconductor, said pads, said wire bond and said semiconductor at least partially encapsulated within a substantially electrically non-conductive material.

\* \* \* \* \*